US011353797B2

(12) United States Patent
Lu et al.

(10) Patent No.: US 11,353,797 B2
(45) Date of Patent: Jun. 7, 2022

(54) METHOD AND APPARATUS FOR CONTROLLING A COMPUTING PROCESS

(71) Applicant: ASML NETHERLANDS B.V., Veldhoven (NL)

(72) Inventors: Yen-Wen Lu, Saratoga, CA (US); Xiaorui Chen, San Jose, CA (US); Yang Lin, Shenzhen (CN)

(73) Assignee: ASML Netherlands B.V., Veldhoven (NL)

( * ) Notice: Subject to any disclaimer, the term of this patent is extended or adjusted under 35 U.S.C. 154(b) by 464 days.

(21) Appl. No.: 16/463,430

(22) PCT Filed: Nov. 24, 2017

(86) PCT No.: PCT/EP2017/080324
§ 371 (c)(1),
(2) Date: May 23, 2019

(87) PCT Pub. No.: WO2018/104073
PCT Pub. Date: Jun. 14, 2018

(65) Prior Publication Data
US 2021/0208510 A1    Jul. 8, 2021

Related U.S. Application Data

(60) Provisional application No. 62/432,527, filed on Dec. 9, 2016.

(51) Int. Cl.
*G05B 19/418* (2006.01)
*G03F 7/20* (2006.01)
(52) U.S. Cl.
CPC ... *G03F 7/70525* (2013.01); *G05B 19/41865* (2013.01); *G05B 2219/45031* (2013.01)

(58) Field of Classification Search
CPC ............ G03F 7/70525; G03F 7/70483; G03F 7/70491; G05B 19/41865;
(Continued)

(56) References Cited

U.S. PATENT DOCUMENTS

| 5,969,441 A | 10/1999 | Loopstra et al. |
| 2006/0009942 A1 | 1/2006 | Keck et al. |

(Continued)

FOREIGN PATENT DOCUMENTS

EP    2927861    10/2015

OTHER PUBLICATIONS

International Search Report and Written Opinion issued in corresponding PCT Patent Application No. PCT/EP2017/080324, dated Mar. 6, 2018.

(Continued)

*Primary Examiner* — Yuhui R Pan
(74) *Attorney, Agent, or Firm* — Pillsbury Winthrop Shaw Pittman LLP

(57) ABSTRACT

A method of controlling a computer process for designing or verifying a photolithographic component includes building a source tree including nodes of the process, including dependency relationships among the nodes, defining, for some nodes, at least two different process conditions, expanding the source tree to form an expanded tree, including generating a separate node for each different defined process condition, and duplicating dependent nodes having an input relationship to each generated separate node, determining respective computing hardware requirements for processing the node, selecting computer hardware constraints based on capabilities of the host computing system, determining, based on the requirements and constraints and on dependency relations in the expanded tree, an execution sequence (Continued)

for the computer process, and performing the computer process on the computing system.

20 Claims, 6 Drawing Sheets

(58) Field of Classification Search
CPC .... G05B 19/41875; G05B 2219/37224; G05B 2219/45031; G06F 30/20; Y02P 90/02
See application file for complete search history.

(56) References Cited

U.S. PATENT DOCUMENTS

| | | |
|---|---|---|
| 2006/0248498 A1 | 11/2006 | Sezginer et al. |
| 2008/0163094 A1 | 7/2008 | Pannese et al. |
| 2010/0198875 A1 | 8/2010 | Rieger et al. |
| 2010/0309920 A1* | 12/2010 | Rosenberg ............ H04L 45/021 370/395.53 |
| 2015/0089511 A1* | 3/2015 | Smith .................... G06F 30/20 718/104 |

OTHER PUBLICATIONS

Sethi, S., et al.: "Computational lithography work flows and design rule exploration automation", Proc. of SPIE, vol. 8327, 2012.
Fühner, T., et al.: "Dr.LiTHO—A Development and Research Lithography Simulator", Proc. of SPIE, vol. 6520, 2007.

* cited by examiner

METHOD AND APPARATUS FOR CONTROLLING A COMPUTING PROCESS

CROSS-REFERENCE TO RELATED APPLICATIONS

This application is the U.S. national phase entry of PCT patent application no. PCT/EP2017/080324, which was filed on Nov. 24, 2017, which claims the benefit of priority of U.S. provisional patent application no. 62/432,527, which was filed on Dec. 9, 2016 and which is incorporated herein in its entirety by reference.

FIELD

The description herein relates generally to systems and methods for controlling resource allocation in a computing process. More particularly, it relates to controlling an execution sequence for steps in a photolithographic design and/or verification process.

BACKGROUND

A lithography apparatus can be used, for example, in the manufacture of integrated circuits (ICs). In such a case, a patterning device (e.g., a mask) may contain or provide a device pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern of the patterning device. In general, a single substrate contains a plurality of adjacent target portions to which the pattern is transferred successively by the lithography apparatus, one target portion at a time. In one type of lithography apparatuses, the pattern of the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern of the patterning device are transferred to one target portion progressively. Since, in general, the lithography apparatus will have a magnification factor M (generally<1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern of the patterning device to a substrate and typically, but optionally, involves one or more related pattern processing steps, such as resist development by a development apparatus, baking of the substrate using a bake tool, etching using the pattern using an etch apparatus, etc.

SUMMARY

A method of controlling a computer process for designing or verifying a photolithographic component includes building a source tree comprising a plurality of nodes of the process, including dependency relationships among the plurality of nodes, defining, for at least one of the nodes, at least two different process conditions for that node, expanding the source tree to form an expanded tree, wherein the expanding includes generating, for each of the different process conditions, a separate node for each different defined process condition, and duplicating, for each generated separate node, dependent nodes having an input relationship to each generated separate node. After expanding the tree, the method further includes determining, for each node in the expanded tree, respective computing hardware requirements for processing the node, selecting computer hardware constraints based on capabilities of a computing system on which the computer process is to be performed, determining, based on the determined hardware requirements and on the selected computer hardware constraints and on dependency relations in the expanded tree, an execution sequence for the computer process, and performing the computer process on the computing system based on the determined execution sequence.

In an embodiment, there is provided a computing system including a processor and a memory, and including a non-transitory machine readable medium including instructions for performing the foregoing method.

In an embodiment, there is provided a computer program product including a computer non-transitory readable medium having instructions recorded thereon, the instructions when executed by a computer implementing the foregoing method.

DETAILED DESCRIPTION OF THE DRAWINGS

Figure 1:
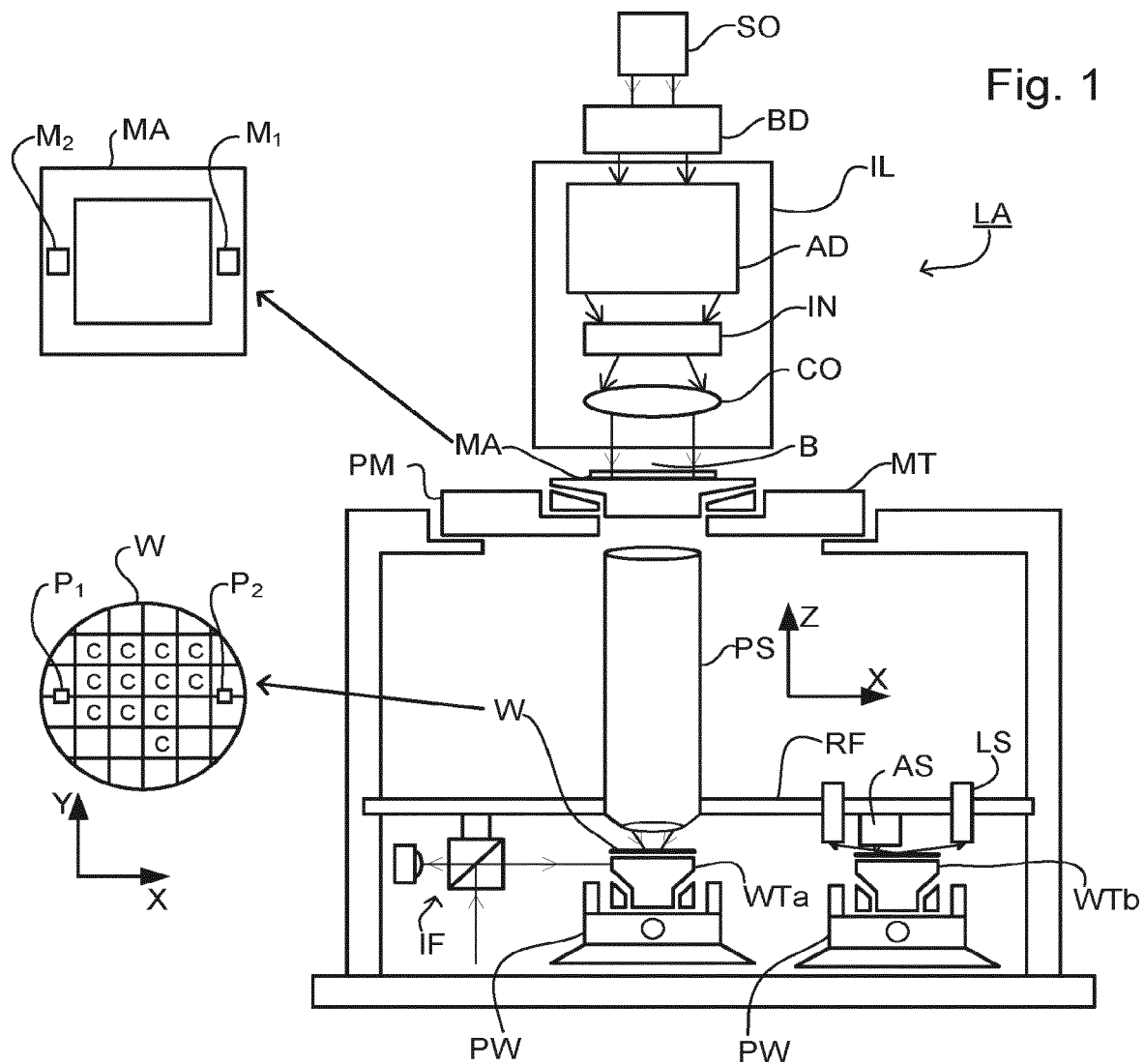
FIG. 1 illustrates a schematic diagram of a lithography apparatus.

FIG. 1 schematically depicts a lithographic apparatus LA in association with which the techniques described herein can be utilized. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; one or more substrate tables (e.g., a wafer table) WTa, WTb constructed to hold a substrate (e.g., a resist coated wafer) W and connected to a second positioner PW configured to accurately position the substrate in accordance with certain parameters; and a projection optical system (e.g., a a refractive, catoptric or catadioptric optical system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation. In this particular case, the illumination system also comprises a radiation source SO.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive patterning device). However, the apparatus may be of a reflective type (e.g., employing a programmable mirror array of a type as referred to above, or employing a reflective mask). The apparatus may employ a different kind of patterning device to classic mask; examples include a programmable mirror array or LCD matrix.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO (e.g., a mercury lamp or excimer laser, LPP (laser produced plasma) EUV source). The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the spatial and/or angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS, measuring the position of alignment markers on the substrate using an alignment sensor AS, performing any other type of metrology or inspection, etc. This enables a substantial increase in the throughput of the apparatus. More generally, the lithography apparatus may be of a type having two or more tables (e.g., two or more substrate tables, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithography apparatuses are described, for example, in U.S. Pat. No. 5,969,441, incorporated herein by reference in its entirety.

While a level sensor LS and an alignment sensor AS are shown adjacent substrate table WTb, it will be appreciated that, additionally or alternatively, a level sensor LS and an alignment sensor AS can be provided adjacent the projection system PS to measure in relation to substrate table WTa.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
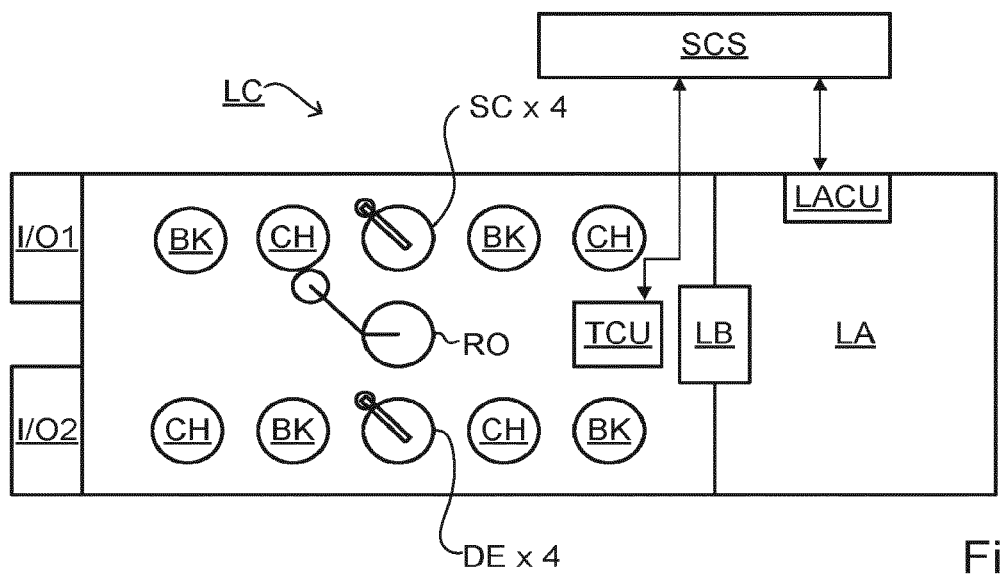
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

The patterning device referred to above comprises, or can form, one or more design layouts or patterns (hereinafter design pattern for convenience). The design pattern can be generated utilizing CAD (computer-aided design) programs, this process often being referred to as EDA (electronic design automation). Most CAD programs follow a set of predetermined design rules in order to create functional design patterns/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The illumination system provides illumination (i.e., radiation) in the form of an illumination mode to a patterning device and the projection system directs and shapes the illumination, via the patterning device, onto a substrate via aerial image (AI). The illumination mode defines the characteristics of the illumination, such as the angular or spatial intensity distribution (e.g., conventional, dipole, annular, quadrupole, etc.), an illumination sigma ($\sigma$) setting, etc. The aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer.

A set of conditions for imaging can be considered, and of the total set of possible conditions, a process window of a pattern is a space is that set of conditions in which processing parameters for producing the pattern are such that satisfactory imaging of the pattern is achieved. That is, for a given pattern, there may be a set of values of depth of focus, illumination intensity, illumination pattern, numerical aperture, and other controllable variables produce images having sufficiently good imaging of lines or features including linewidth, pitch, or other aspects of the imaged pattern that are defined as meeting the specifications for the required imaging. The process window gives an indication of the process sensitivity to variations in input parameters such as radiation dose.

Processing parameters are parameters of the patterning process. The patterning process may include processes upstream and downstream to the actual lithographic transfer of the pattern. Processing parameters may belong to a number of categories. A first category may be parameters of the lithography apparatus or any other apparatuses used in the patterning process. Examples of this category include parameters of the illumination system, projection system, substrate stage, etc. of a lithography apparatus. A second category may be parameters of any procedures performed in the patterning process. Examples of this category include focus, dose, bandwidth, exposure duration, development temperature, chemical compositions used in development, etc. A third category may be parameters of the design pattern. Examples of this category may include resolution enhancement technique (RET) or optical proximity correction adjustments such as shapes and/or locations of assist features. A fourth category may be parameters of the substrate. Examples include characteristics of structures under a resist layer, chemical composition of the resist layer, and/or physical dimensions of the resist layer. A fifth category may be parameters that represent a characteristic of temporal variation of one or more parameters of the patterning process. Examples of this category may include a characteristic of high frequency stage movements (e.g., frequency, amplitude, etc.), a high frequency laser bandwidth change (e.g., frequency, amplitude, etc.) and/or a high frequency laser wavelength change. These high frequency changes or movements are those above the response time of a mechanism to adjust the underlying parameter (e.g., stage position, laser intensity, etc.). A sixth category may be a characteristic upstream or downstream to exposure, such as post-exposure bake (PEB), development, etching, deposition, resist application, doping and/or packaging.

Various patterns in the design pattern may have different process windows. Examples of pattern specifications that relate to potential systematic defects include checks for CD, necking, line pull back, line thinning, edge placement, overlapping, resist top loss, resist undercut and/or bridging. The process window of all the patterns in the design pattern or a portion thereof may be obtained by merging (e.g., overlapping) process windows of each individual pattern.

In an example, when the specification of a pattern only dictates the CD of the pattern, the process window of the pattern may be called a CD process window (CD-PW). When the specification of a pattern only dictates the CDs of a group of patterns, the overlapping process window of the group of patterns may be called a CD overlapping process window (CD-OPW). A CD-PW or CD-OPW may have sub-PWs. FIG. 4A shows sub-PWs, spanned by focus (horizontal axis) and dose (vertical axis), of CD (CD-PWs) of each of four patterns. FIG. 4B shows a sub-PW (represented by the dot-hatched area), spanned by focus (horizontal axis) and dose (vertical axis), of CD (CD-OPW) of the four patterns. Thus, the CD-OPW is the overlapping area of the CD-PWs of the four patterns.

In performing process design tasks, portions of the process may be modeled or simulated. Different process conditions and pattern layouts can be evaluated via model in order to determine whether the design will produce the desired results. Behavior of the lithography system as well as the chemical and physical processes involved in the manufacturing process can be modeled.

The modeling for the lithography system may include, for example, an illumination model that incorporates properties of the illumination subsystem, illumination mode (including, for example, numerical aperture, sigma, illumination shape angular, phase, and intensity distributions), a projection model that incorporates properties of the projection optical system (including, for example, aberrations, transmissivity, refractive indexes, phase effects, dispersion, diffraction, etc.), a design pattern model incorporating features of the design to be projected (including, for example, the pattern, optical proximity correction features, diffraction effects, etc.), a resist model incorporating physical characteristics of the resist (including, for example, dose sensitivity, positive or negative resist response, etc.).

Though the subject method is applicable to a variety of design or verification processes, a verification process will serve as an example embodiment. A plurality of data items defining the verification process are defined as schematically illustrated in FIG. 3.

Figure 3:
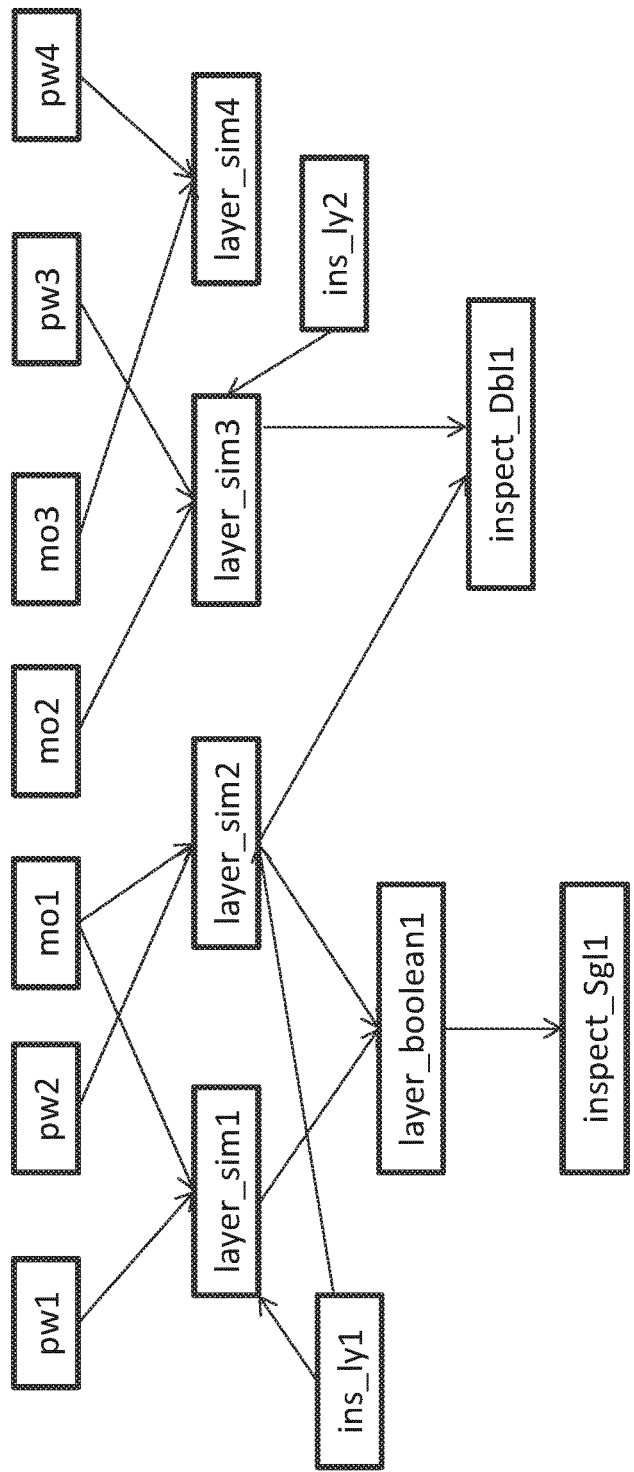
FIG. 3 is an example of a source tree showing dependency relationships among a group of nodes in a process in accordance with an embodiment.

FIG. 3 illustrates a particular tree that has as an end point an inspection process. The tree has a plurality of process windows pw1, pw2, pw3, pw4, a plurality of models mo1, mo2, mo3, a plurality of layer simulations, layer_sim1, layer_sim2, layer_sim3, layer_sim4, a plurality of input layers, ins_ly1, ins_ly2, and a plurality of inspection/detector processes, inspect_Sgl1, and inspect_Dbl1. The second inspection, inspect_Dbl1 is "double" in that it represents a process with two inputs as shown by the two arrows connecting with this node. This tree may be referred to as a result tree, in that the tree moves from a group of selected inputs to effective end nodes.

Each item in the tree is referred to as a node and each node represents one aspect of the overall process. Though the nodes of FIG. 3 are labeled as process windows, models, layer simulations, and inspection steps, they may, in principle, represent any type of step in the overall process, for example, detector, geometry, and/or layer operations. Each node has one or more relationships by which it is connected to one or more other nodes in the tree as a dependency relationship. The dependency relationships are illustrated with arrows in FIG. 3, where an arrow coming into a node indicates that that node is dependent on the source of the arrow. A dependency may be, for example, an input/output relationship in which one process accepts as an input, the output of another process. Where a node represents a set of conditions, the conditions of that node may represent an input to a dependent node.

Once the tree is defined, it can be evaluated. As a practical matter, each individual step may involve considerable computational capacity, either in terms of memory or processing power, or both. The operation can be optimized based on either of these constraints, or may be balanced between the two.

Figure 4:
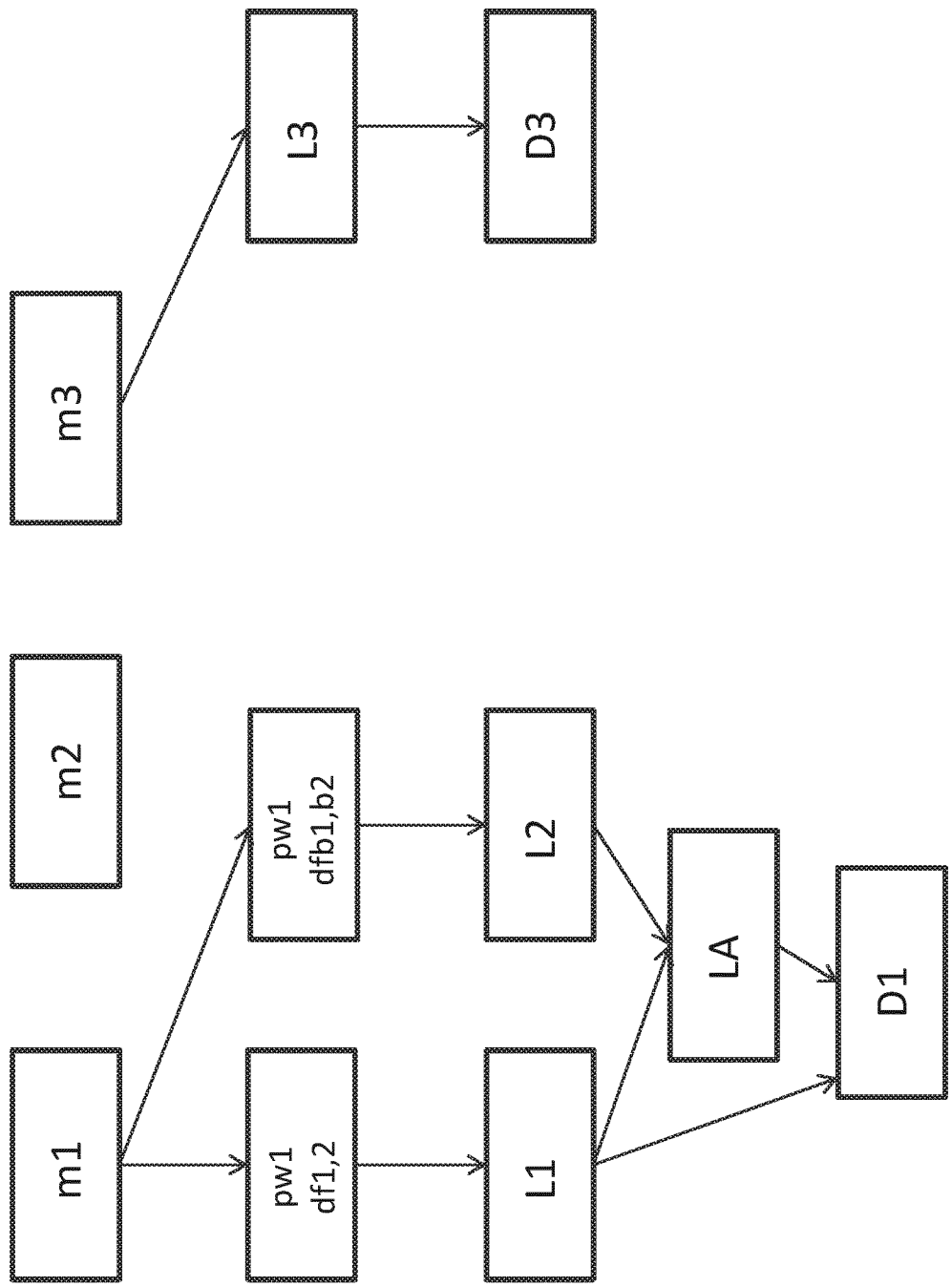
FIG. 4 is an alternate example of a source tree showing dependency relationships among a group of nodes in a process in accordance with an embodiment.

A method of controlling the balance between memory and processing power therefore begins with defining a source tree. FIG. 4 is a schematic representation of a simplified source tree. In the source tree, there are a plurality of models m1, m2, m3, a plurality of process windows pw1, pw2, each with two different focus conditions df1,2 and dfb1,b2, a plurality of input layers L1, L2, a layer simulation LA that is dependent on both L1 and L2, and a detector (inspection/verification) step D1. This means that the tree will be expanded over the two different process windows and over the two different focus conditions for each process window to produce an expanded tree that represents the complete computation necessary to perform the validation.

Figure 5:
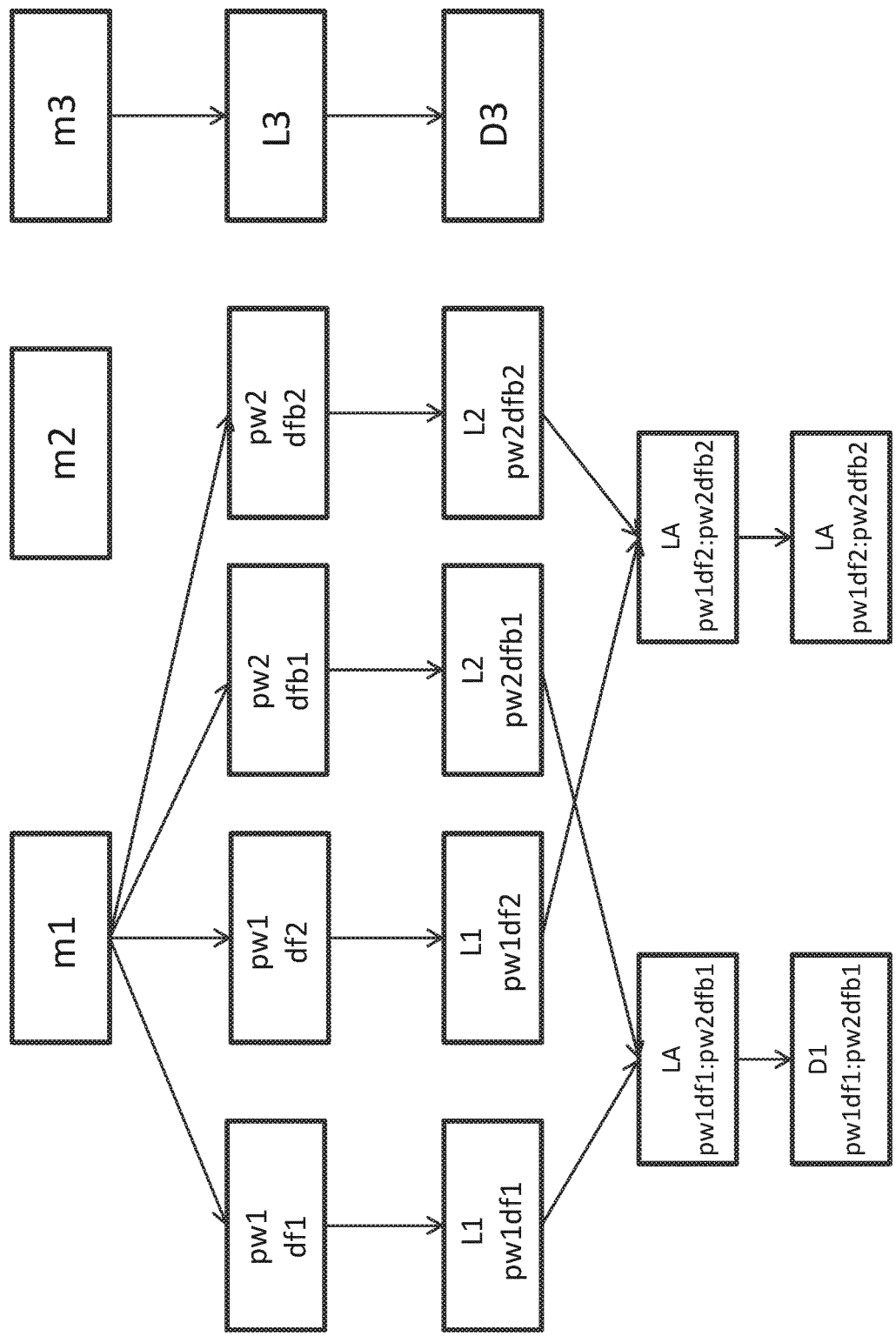
FIG. 5 is an expanded version of the source tree of FIG. 4.

Expanding the source tree involves generating, for each set of conditions, a separate node for each different defined condition. So for each of the two process windows, one node will be generated. Likewise, for each of the two focus conditions for each process window, one node will be generated. This means that in total, there will be four process window nodes after expansion and as illustrated in FIG. 5. The four nodes are pw1:df1, pw1:df2, pw2:dfb1, and pw2:dfb2. Because the input layers depend from the pw nodes, they must likewise be duplicated, producing L1:pw1:df1, L1:pw1:df2, L2:pw2:dfb1, and L2:pw2:dfb2. Similarly, LA is duplicated, producing LA:pw1:df1:pw2:dfb1, and LA:pw1:df2 pw2:dfb2. Finally, D1 is duplicated as depending from the now duplicated LA nodes. Because nothing depending from m2 or m3 is expanded, there are no further duplications.

Once the expanded tree is generated, it is useful to determine a sequence in which the nodes may be evaluated that retains the required order based on the dependencies. As noted above, it may also be useful to take into consideration any constraints based on storage (memory) and computational demand (processor load), as well as working to reduce repeated execution of any individual node. In an embodiment, there may be a user-selectable value for balance between storage and computational requirements.

In one approach to generating the order, a first step may involve tracking dependencies backwards from a selected simulation node. By way of example, referring to FIG. 5, a sequence from LA:pw1:df1:pw2:dfb1 tracks backwards through L1:pw1:df1 to pw1:df1 to m1. Then the second dependency path is tracked and it proceeds through L2:pw2:dfb1, to pw2dfb1, to m1.

Next, dependencies from the selected sim node are tracked forward. In the example of FIG. 5, LA:pw1:df1:pw2:dfb1 leads only to D1:pw1:df1:pw2:dfb1. Proceeding in this way, each node and its dependencies can be evaluated and ordered.

Once they are ordered, the nodes may be sequenced for processing in a computed order which may be determined with a variety of preferences. In essence, a cost function may be built, the evaluation of which will determine an order of processing based on the preference which may be, for example, determined based on available memory or computational resources. In an embodiment, computing resources need not be considered, and the tree building and expansion process may be performed without evaluating computer processing hardware or software constraints.

The expanded tree of FIG. 5 includes 17 nodes arranged in a five deep arrangement, with m1 . . . m3 at step 0 and the expanded D1 at step 4. For each node, a step value and a life span value may be assigned as shown in Table 1.

TABLE 1

| Node | Step | Life Span |
|---|---|---|
| m1 | 0 | 4 |
| m2 | 0 | 0 |
| m3 | 0 | 2 |
| pw1df1 | 1 | 4 |
| pw1df2 | 1 | 4 |
| pw2fb1 | 1 | 4 |
| pw2fb2 | 1 | 4 |
| L1:pw1df1 | 2 | 4 |
| L1:pw1df2 | 2 | 4 |
| L2:pw2dfb1 | 2 | 4 |
| L2:pw2dfb2 | 2 | 4 |
| LA:pw1df1:pw2dfb1 | 3 | 4 |
| LA:pw1df2:pw2dfb2 | 3 | 4 |
| D1:pw1df1:pw2fb1 | 4 | 4 |
| D1:pw1df1:pw2dfb2 | 4 | 4 |
| L3 | 1 | 2 |
| D3 | 2 | 2 |

In this example, the life span is the level at which the node no longer has any dependent nodes. That is, it is a dimensionless time unit indicating how long the node is relevant to other nodes. So m2, which has no dependencies, may be extinguished after the first (level 0) step, for example, while pw1 and L1 each have dependencies through step 4, and thus survive thorough four steps forward in time.

Once the step and life span relationships are established, there are a number of possible approaches to determining how best to proceed.

In a first example, the minimum computation may be selected. In this approach, nodes will be executed by each result tree and the system seeks to ensure that each node is executed only once.

As the system steps through the tree, a count is executed for each node. For example, m1 begins at step 0 with a count of zero. For each level step through the tree (i.e., progress from step 0 to step 1), m1's step count is incremented by 1. When a nodes step count reaches its life span, that node's storage may be released as it has completed its contribution to the tree. In accordance with this approach, storage associated with m1 will be released after completion of step 4, while m2, with a life span of 0, will be released after the first step and m3 will be released after completion of level 2 (i.e., after three steps). Node L1:pw1df2 would begin at step 2 with a step count of 2 and would be released after step 4. That is, each node has a count that equals its initial degree (level in the tree) that is incremented until it reaches its life span.

Figure 6:
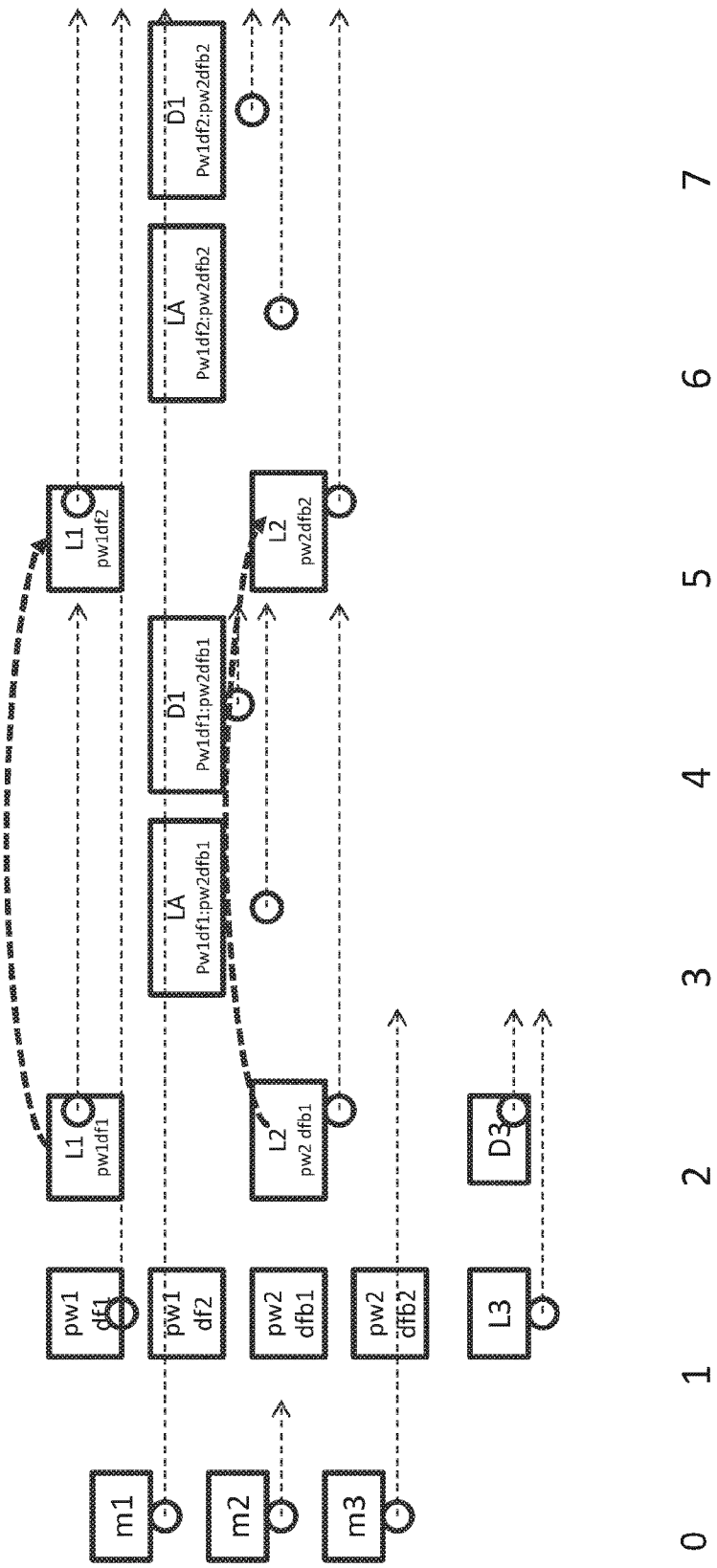
FIG. 6 is an example of a tree in which nodes are placed in series to reduce a storage demand on the execution.

In a second example, the minimum storage may be selected. In this approach, rather than ensure that each node is processed only once, the emphasis is on ensuring that processes occupy memory for a minimum time. In this case, rather than incrementing from an initial step to the life span, each node has an end level of 1. After the current level has been processed, the previous level nodes are incremented. When the incremented level is greater than or equal to 1, then that node's storage is released. In this way, the total storage used is no more than the total number of nodes at any one level. Looking to the example of FIG. 5, this would mean that at, for example, level 1 and level 2, five units of memory would be required (assuming that each node has similar requirements, in practice, each node may have different requirements, and, for example, each pw node may require 1 unit while each L node may require 2 and each D node may require one half, meaning that the requirements would be, six memory units for level 1 and 8.5 units for level 2). As will be evident to the skilled artisan, this approach results in re-processing several nodes as they are used in subsequent operations, as no node is stored beyond one step.

Where the system is constrained in a manner such that the total required memory is greater than the allocated or available memory, then the tree may be stretched to ensure that sufficient memory is available at each level. An example is illustrated in FIG. 6 in which the LA and D processes are spread out over time such that the overall tree is extended to eight levels from five.

In another embodiment, an adjustable preference can be selected. For each node that has a degree greater than one (that is, all nodes that have at least two other nodes dependent upon them), and create an order based on the degree and the processing cost for processing that node. In an example, the degree may be multiplied by the cost to determine the ranking The higher value nodes can be set to have a high end level while the lower value nodes can be set to have an end level of 1. This may be performed, for example, on the basis of a selected percentage between zero and 1. When the value is zero, the process takes on the characteristics of the least storage approach described above and all nodes have an end level of 1. When the value is 1, the process takes on the characteristics of the least processing approach, and all nodes have an end value equal to their life span. Intermediate values provide intermediate solutions.

As will be appreciated by one of ordinary skill in the art, the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit,"

"module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (e.g. EPROM or Flash memory), an optical fiber, a portable compact disc read-only memory CDROM, an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency RF, etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network LAN or a wide area network WAN, or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present application has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

Figure 7:
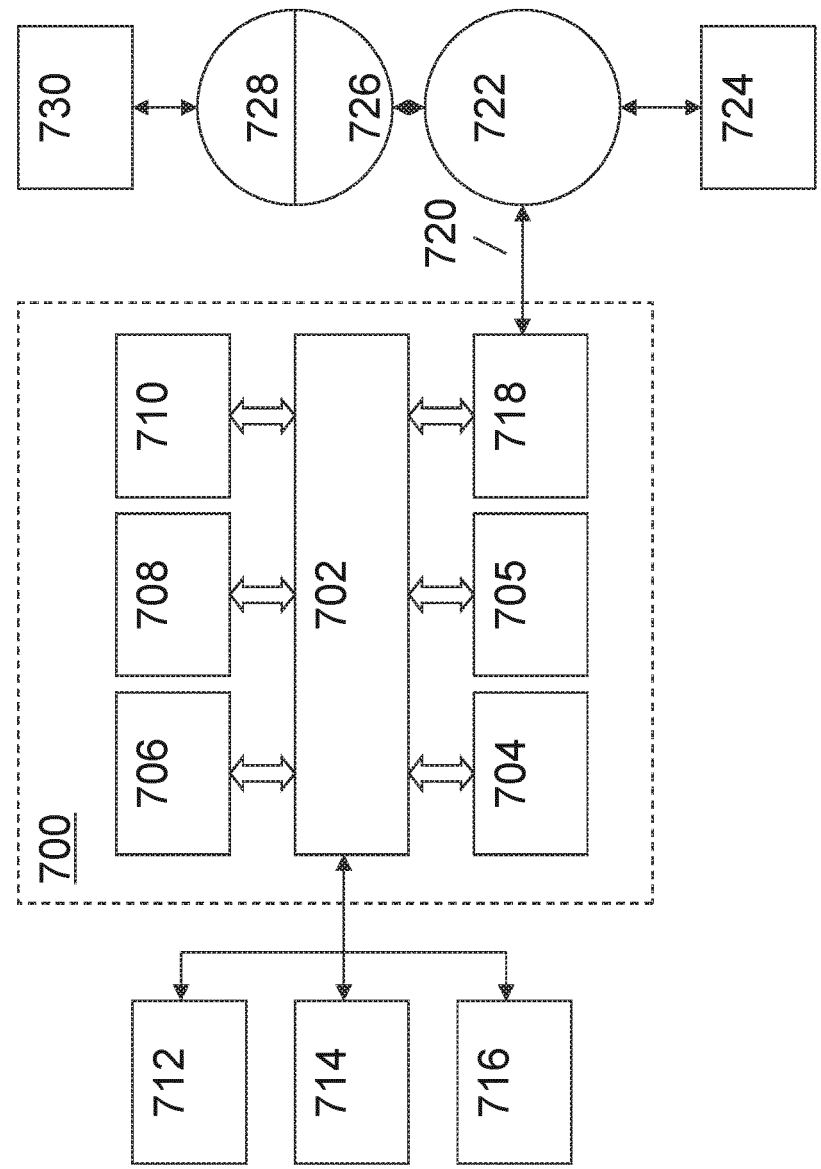
FIG. 7 is a schematic illustration of a computing system in accordance with an embodiment of the invention.

FIG. 7 shows a block diagram that illustrates an embodiment of a computer system 700 which can assist in implementing any of the methods and flows disclosed herein. Computer system 700 includes a bus 702 or other communication mechanism for communicating information, and a processor 704 (or multiple processors 704 and 705) coupled with bus 702 for processing information. Computer system 700 also includes a main memory 706, such as a random access memory RAM or other dynamic storage device, coupled to bus 702 for storing information and instructions to be executed by processor 704. Main memory 806 also may be used for storing temporary variables or other intermediate information during execution of instructions to be executed by processor 704. Computer system 700 further includes a read only memory ROM 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a cathode ray tube (CRT) or flat panel or touch panel display for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. This input device typically has two degrees of freedom in two axes, a first axis (e.g. x) and a second axis (e.g. y), that allows the device to specify positions in a plane. A touch panel (screen) display may also be used as an input device.

According to one embodiment, portions of a process described herein may be performed by computer system 700 in response to processor 704 executing one or more sequences of one or more instructions contained in main memory 706. Such instructions may be read into main memory 706 from another computer-readable medium, such as storage device 710. Execution of the sequences of instructions contained in main memory 706 causes processor 704 to perform the process steps described herein. One or more processors in a multi-processing arrangement may also be employed to execute the sequences of instructions contained in main memory 706. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 704 for execution, and in particular, tangible media. Such a medium may take many forms, including but not limited to, non-volatile media, volatile media, and transmission media. Non-volatile media include, for example, optical or magnetic disks, such as storage device 710. Volatile media include dynamic memory, such as main memory 706. Transmission media include coaxial cables, copper wire and fiber optics, including the wires that comprise bus 702. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 704 for execution. For example, the instructions may initially be borne on a magnetic disk of a remote computer. The remote computer can load the instructions into its dynamic memory and send the instructions over a telephone line using a modem. A modem local to computer system 700 can receive the data on the telephone line and use an infrared transmitter to convert the data to an infrared signal. An infrared detector coupled to bus 702 can receive the data carried in the infrared signal and place the data on bus 702. Bus 702 carries the data to main memory 706, from which processor 704 retrieves and executes the instructions. The instructions received by main memory 706 may optionally be stored on storage device 710 either before or after execution by processor 704.

Computer system 700 may also include a communication interface 718 coupled to bus 702. Communication interface 718 provides a two-way data communication coupling to a network link 720 that is connected to a local network 722. For example, communication interface 718 may be an integrated services digital network ISDN card or a modem to provide a data communication connection to a corresponding type of telephone line. As another example, communication interface 718 may be a local area network LAN card to provide a data communication connection to a compatible LAN. Wireless links may also be implemented. In any such implementation, communication interface 718 sends and receives electrical, electromagnetic or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider ISP 726. ISP 726 in turn provides data communication services through the worldwide packet data communication network, now commonly referred to as the "Internet" 728. Local network 722 and Internet 728 both use electrical, electromagnetic or optical signals that carry digital data streams. The signals through the various networks and the signals on network link 720 and through communication interface 718, which carry the digital data to and from computer system 700, are exemplary forms of carrier waves transporting the information.

Computer system 700 can send messages and receive data, including program code, through the network(s), network link 720, and communication interface 718. In the Internet example, a server 730 might transmit a requested code for an application program through Internet 728, ISP 726, local network 722 and communication interface 718. One such downloaded application may provide for a method or portion thereof as described herein, for example. The received code may be executed by processor 704 as it is received, and/or stored in storage device 710, or other non-volatile storage for later execution. In this manner, computer system 700 may obtain application code in the form of a carrier wave.

The embodiments may further be described using the following clauses:

1. A method of controlling a computer process for designing or verifying a photolithographic component, comprising:

building a source tree comprising a plurality of nodes of the process, including dependency relationships among the plurality of nodes;

defining, for at least one of the nodes, at least two different process conditions for that node;

expanding the source tree to form an expanded tree, wherein the expanding comprises:

generating, for each of the different process conditions, a separate node for each different defined process condition; and duplicating, for each generated separate node, dependent nodes having an input relationship to each generated separate node;

determining, for each node in the expanded tree, respective computing hardware requirements for processing the node;

selecting computer hardware constraints based on capabilities of a computing system on which the computer process is to be performed;

determining, based on the determined hardware requirements and on the selected computer hardware constraints and on dependency relations in the expanded tree, an execution sequence for the computer process; and performing the computer process on the computing system based on the determined execution sequence.

2. A method as in clause 1, wherein the computer hardware constraints are selected from the group consisting of: processing power, memory, and combinations thereof.
3. A method as in any of the previous clauses, wherein the selecting computer hardware constraints comprises selecting minimizing an amount of memory required to execute the computer process.
4. A method as in any of the previous clauses, wherein the selecting computer hardware constraints comprises selecting minimizing an amount of processing power required to execute the computer process.
5. A method as in any of the previous clauses, wherein the selecting computer hardware constraints comprises selecting an intermediate value between minimizing an amount of memory required and minimizing an amount of memory required to execute the computer process.
6. A method as in any of the previous clauses, wherein the nodes of the process represent inputs selected from the group consisting of: models, process windows, focus conditions, layer designs, layer simulations, detector processes, or geometry.
7. A method as in any of the previous clauses, wherein the dependency relationships include input and output relationships.
8. A method as in any of the previous clauses, wherein the determining an execution sequence further comprises:
defining a plurality of time steps for performing the computer process;
assigning each node to a time step; and
assigning each node a life span in time steps.
9. A method as in any of the previous clauses, wherein the life span of each node comprises a number of time steps in which there exists at least one node that has a dependency on that node.
10. A computing system comprising a processor and a memory, and including a non-transitory machine readable medium comprising instructions for performing the method of any of clauses 1 to 9.
11. A computer program product comprising a non-transitory machine readable medium having instructions recorded thereon, the instructions when executed by a computer implementing the method of any of clauses 1 to 9.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:
1. A method of controlling a computer process for designing or verifying at least part of a device manufacturing method, the method comprising:
building a source tree comprising a plurality of nodes of the process, including dependency relationships among at least some of the plurality of nodes;
defining, for at least one of the nodes, at least two different process conditions of the device manufacturing method for that at least one node;
expanding the source tree to form an expanded tree, wherein the expanding comprises:
generating, for each of the different process conditions, a separate node for each different defined process condition; and
duplicating, for each generated separate node, one or more dependent nodes having an input relationship to each generated separate node;
determining, for each node in the expanded tree, respective computing hardware requirements for processing the node;
selecting one or more computer hardware constraints based on capabilities of a computing system on which the computer process is to be performed;
determining, based on the determined hardware requirements and on the selected one or more computer hardware constraints and on dependency relationships in the expanded tree, an execution sequence for the computer process; and
performing the computer process on the computing system based on the determined execution sequence.
2. The method as in claim 1, wherein the one or more computer hardware constraints include processing power and/or memory.
3. The method as in claim 1, wherein the selecting one or more computer hardware constraints comprises selecting minimizing an amount of memory required to execute the computer process.
4. The method as in claim 1, wherein the selecting computer one or more hardware constraints comprises selecting minimizing an amount of processing power required to execute the computer process.
5. The method as in claim 1, wherein the selecting one or more computer hardware constraints comprises selecting an intermediate value between minimizing an amount of memory required to execute the computer process and minimizing an amount of processing power required to execute the computer process.

6. The method as in claim 1, wherein at least one of the nodes of the process represents one or more inputs selected from: a model, a process window, a focus condition, a layer design, a layer simulation, a detector process, or geometry.

7. The method as in claim 1, wherein the dependency relationships include input and output relationships.

8. The method as in claim 1, wherein the determining an execution sequence further comprises:
defining a plurality of time steps for performing the computer process;
assigning each node to a time step; and
assigning each node a life span in time steps.

9. The method as in claim 8, wherein the life span of each node comprises a number of time steps in which there exists at least one node that has a dependency on that node.

10. A computing system comprising:
a processor; and
a non-transitory machine readable medium comprising instructions for performing the method of claim 1.

11. A computer program product comprising a non-transitory machine-readable medium having instructions therein, the instructions, upon execution by a computer system, configured to cause the computer system to at least:
build a source tree comprising a plurality of nodes of a computer process for designing or verifying at least part of a device manufacturing method, including dependency relationships among at least some of the plurality of nodes;
define, for at least one of the nodes, at least two different process conditions of the device manufacturing method for that at least one node;
expand the source tree to form an expanded tree, wherein the expansion comprises:
generation, for each of the different process conditions, of a separate node for each different defined process condition; and
duplication, for each generated separate node, of one or more dependent nodes having an input relationship to each generated separate node;
determine, for each node in the expanded tree, respective computing hardware requirements for processing the node;
select one or more computer hardware constraints based on capabilities of a computing system on which the computer process is to be performed;
determine, based on the determined hardware requirements and on the selected one or more computer hardware constraints and on dependency relationships in the expanded tree, an execution sequence for the computer process; and
perform the computer process on the computing system based on the determined execution sequence.

12. The computer program product of claim 11, wherein the one or more computer hardware constraints include processing power and/or memory.

13. The computer program product of claim 11, wherein the selection of one or more computer hardware constraints comprises selection of minimization of an amount of memory required to execute the computer process.

14. The computer program product of claim 11, wherein the selection of one or more computer hardware constraints comprises selection of minimization of an amount of processing power required to execute the computer process.

15. The computer program product of claim 11, wherein the selection of one or more computer hardware constraints comprises selection of an intermediate value between minimization of an amount of memory required to execute the computer process and minimization of an amount of processing power required to execute the computer process.

16. The computer program product of claim 11, wherein at least one of the nodes of the process represents one or more inputs selected from: a model, a process window, a focus condition, a layer design, a layer simulation, a detector process, or geometry.

17. The computer program product of claim 11, wherein the dependency relationships include input and output relationships.

18. The computer program product of claim 11, wherein instructions configured to cause the determination of an execution sequence is further configured to cause the computer system to:
define a plurality of time steps for performing the computer process;
assign each node to a time step; and
assign each node a life span in time steps.

19. The computer program product of claim 18, wherein the life span of each node comprises a number of time steps in which there exists at least one node that has a dependency on that node.

20. The computer program product of claim 11, wherein the device manufacturing process comprises a lithographic projection step.

* * * * *